United States Patent
Clasen et al.

(10) Patent No.: US 7,330,347 B2
(45) Date of Patent: Feb. 12, 2008

(54) CAPACITOR

(75) Inventors: Helge Clasen, Ulm (DE); Ralf Deisenhofer, Senden (DE)

(73) Assignee: Kemet Electronics Corporation, Greenville, SC (US)

( * ) Notice: Subject to any disclaimer, the term of this patent is extended or adjusted under 35 U.S.C. 154(b) by 67 days.

(21) Appl. No.: 10/481,487

(22) PCT Filed: Jun. 6, 2002

(86) PCT No.: PCT/DE02/02065

§ 371 (c)(1),
(2), (4) Date: Aug. 6, 2004

(87) PCT Pub. No.: WO03/003394

PCT Pub. Date: Jan. 9, 2003

(65) Prior Publication Data

US 2004/0264109 A1 Dec. 30, 2004

(30) Foreign Application Priority Data

Jun. 28, 2001 (DE) .................................. 101 31 236

(51) Int. Cl.
*H01G 9/00* (2006.01)
(52) U.S. Cl. ............... 361/523; 361/516; 361/519; 361/525; 361/528; 361/529; 29/25.01; 29/25.03
(58) Field of Classification Search .......... 361/523–534, 361/516–519; 29/25.03
See application file for complete search history.

(56) References Cited

U.S. PATENT DOCUMENTS

| | | | |
|---|---|---|---|
| 3,781,976 A | 1/1974 | Tomiwa | |
| 5,424,909 A * | 6/1995 | Kuriyama | 361/534 |
| 5,478,965 A | 12/1995 | Hashiba | |
| 5,667,536 A * | 9/1997 | Hasegawa | 29/25.03 |
| 6,139,593 A * | 10/2000 | Kono | 29/25.03 |
| 6,392,869 B2 * | 5/2002 | Shiraishi et al. | 361/523 |
| 6,430,033 B1 * | 8/2002 | Mitsui et al. | 361/525 |
| 6,493,213 B1 * | 12/2002 | Clasen et al. | 361/528 |
| 6,696,138 B2 * | 2/2004 | Sakai et al. | 428/209 |
| 6,744,620 B2 * | 6/2004 | Hipp et al. | 361/516 |
| 6,819,546 B2 * | 11/2004 | Kuriyama | 361/535 |

FOREIGN PATENT DOCUMENTS

| | | |
|---|---|---|
| DE | 100 40 854 | 4/2001 |
| GB | 2 053 568 | 5/1980 |

(Continued)

OTHER PUBLICATIONS

Taiwan Office Action dated Apr. 1, 2004 in Application 91113229.

*Primary Examiner*—Nguyen T. Ha
(74) *Attorney, Agent, or Firm*—J. Herbert O'Toole; Nexsen Pruet, LLC

(57) ABSTRACT

A capacitor includes an anode body and a housing having a base surface. The housing encloses the anode body at least partially. The capacitor also includes an anode connector and an anode contact that extends outward from an interior of the anode body. The anode contact has a flat side. The anode connector includes a surface containing a soft-solderable material, and a segment running along the base surface of the housing that forms a soldering surface.

14 Claims, 2 Drawing Sheets

FOREIGN PATENT DOCUMENTS

| | | |
|---|---|---|
| JP | 107 4714 | 3/1989 |
| JP | 03034505 | 2/1991 |
| JP | 2000030978 | 1/2000 |
| JP | 2000058401 | 2/2000 |
| JP | 2001006979 | 1/2001 |
| WO | WO01/16973 | 3/2001 |

* cited by examiner

// CAPACITOR

TECHNICAL FIELD

The invention relates to a capacitor with an anode body, which is surrounded by a housing. An anode contact with a flat side extends outward from the interior of the anode body. The housing features a base surface, on the underside of which is provided a soldering surface connected to the anode contact in an electrically conductive manner.

BACKGROUND

Capacitors of the type mentioned above are known from publication WO 01/16973, which are tantalum electrolyte capacitors in chip construction. The known capacitors feature a sheet-shaped anode contact that extends outwardly from the anode body, exiting the anode body from a face of the housing. From the point of exit from the housing, the anode contact is bent in the direction of the base surface. At the edge between the face and the base surface, the anode is bent inward a second time, forming a soldering surface at the base surface of the housing. On another face of the housing, a cathode contact extends outwardly from the housing and is also bent several times, so that a corresponding soldering surface for the anode contact is also present on the underside of the housing. Using the two soldering surfaces, the component can be soldered onto a printed circuit board in chip construction.

A drawback of known capacitors is that the anode contact, which is made from a tantalum sheet, is not easily soldered by means of soft soldering. To create a permanent and conductive connection to a printed circuit board, the tantalum sheet must be designed to be capable of being soldered and glued. However, tantalum surfaces are poorly wettable or not wettable at all with the solders normally used in joining technology. For this reason, a surface made of tantalum cannot be soldered without additional treatment.

Therefore, extensive measures are necessary to obtain a soldering surface that is based on this tantalum sheet and provided on the underside of the housing. One measure for making the tantalum sheet solderable would be, for example, chemical or electrochemical nickel-plating or tin-plating, in which the housing surface surrounding the soldering surface is also metal-coated so as to ensure the adhesive capacity of the solder and an adequate frictional connection between the component and a printed circuit board underneath it. This form of tin-plating contact elements on a component is a complex process that increases the costs of producing the component to an unwanted degree.

Another disadvantage of known capacitors is that a large amount of tantalum material is used for extending the tantalum sheet out of the anode body and housing and bending the tantalum sheet multiple times. This is disadvantageous because tantalum is a very expensive material.

In addition, known capacitors have the disadvantage that, on the one hand, the width of the tantalum sheet passing into the anode body determines the electrical properties of the capacitor and, on the other, the soldering surfaces on the underside of the housing, for reasons of standardization, must have specific, predetermined dimensions.

It is not always possible to adjust the electrical properties of the capacitor to the standard corresponding to the desired structural form, which results in related drawbacks in terms of production flexibility.

SUMMARY

The goal of this invention, therefore, is to specify a component of the type initially mentioned, in which it is possible to dispense with making poorly solderable materials solderable.

This goal is accomplished with a capacitor according to claim 1. Advantageous embodiments of the invention can be inferred from the remaining claims.

The invention is directed to a capacitor that features an anode body, which is surrounded by a housing with a base surface. An anode contact extending outwardly from the interior of the anode body features a flat side. The anode body is welded to an anode connector. The anode connector has a soft-solderable material on its surface. A section of the anode connector running along the base surface of the housing forms a soldering surface at that point.

An advantage of the capacitor according to the invention is that the soldering surface on the base surface of the housing is not formed by the anode contact extending outwardly from the anode body, but from an anode connector with a solderable surface. As a result, it is not necessary to make the anode contact solderable.

Materials that may be used for the anode contact are, in particular, those that contain a refractory metal. Refractory metals are, for example, titanium, zircon, hafnium, tantalum, niobium, vanadium, tungsten and molybdenum. In principle, these refractory metals are suitable for producing solid electrolyte capacitors, such as those that have already been produced as tantalum electrolyte capacitors or as niobium electrolyte capacitors. However, alloys of these refractory metals may also be used as a material for the anode contact.

The anode contact can also contain a non-solderable material, such as zircon, tantalum, niobium, molybdenum or tungsten. Because of the weld joint between the anode contact and the anode connector, solderability of the anode contact is no longer necessary.

In one embodiment of the invention, a terminal segment of the anode contact provided within the housing is welded to an anode connector. The anode connector extends on a face of the housing and, at the point of exit from the housing, is bent toward the base surface of the housing. At the base surface itself, the anode connector is bent inward again, so that it forms a soldering surface at that point.

An advantage of this embodiment of the invention is that the anode contact already ends inside the housing and, therefore, only a small amount of material is needed for the anode contact. Because tantalum is often used for the anode contact, this results in an economic benefit.

In another embodiment of the invention, the anode contact exits the housing in a face of the housing. A segment of the anode contact located outside the housing is welded to an anode connector and bent toward the base surface of the housing. The anode connector continues the anode contact in the direction of the base surface and is bent inward at the base surface, so as to form a soldering surface at the base surface The anode contact can exit the face of the housing at approximately half the height of the housing and be bent toward the base surface of the housing. The advantage of this type of anode contact is that the capacitor can be soldered to either the soldering surface provided on the base surface of the base object or to a segment extending away from the base surface along the face of the housing toward the point of exit of the anode contact from the housing. Such solderability of the lateral flap of the anode contact is required under various standards. For example, standard IEC 60068-

2-58 requires that it be possible to wet at least 95% of the entire connecting flat surface with solder. According to a US regulation, IPC/EIA J-STD-002A, wettability of the portion of the anode contact located on the face side of the housing is only required across the thickness of the anode contact.

Furthermore, it is advantageous if the anode connector and the anode contact are in the shape of a strip running in a longitudinal direction, wherein the width of the anode connector differs from the width of the anode contact. Anode connectors and anode contacts in the shape of a strip running in a longitudinal direction are especially easy to manufacture, such as in the form of metal sheets.

A strip-shaped anode contact is also advantageous because the anode body can be applied to the anode contact by means of screening a paste.

The shape of a strip for the anode connector is advantageous because, as a result, a stable weld joint can be produced by two-dimensional layering of the anode contact and anode connector. By selecting different widths for the anode connector and anode contact, the width of the anode contact corresponding to specific, predetermined electrical properties of the capacitor can be adjusted to housing standards for the soldering surface by selection of a suitable width for the anode connector.

It is especially advantageous when the width of the anode contact is smaller than the width of the anode connector. This allows for the adjustment of narrow anode contacts, as is necessary for capacitors with specific electrical properties, to the widths of the soldering surface on the underside of the housing that are required for reasons of standardization.

The anode connector can be made soft-solderable in that nickel, copper, cobalt, tin, a precious metal or steel is present on its surface. It is also possible to achieve solderability of the anode connector using an alloy of the named metals.

The weld joint between the anode contact and the anode connector can be advantageously produced in that the anode contact and the anode connector overlap one another and in that weld points that delimit a surface are placed on the overlap surface. This ensures that the anode connector is secured to the anode contact across a large area and with the corresponding stability.

In smaller capacitors designs, however, it is advantageous, for reasons of space, to establish the weld joint between the anode contact and the anode connector with only one weld point.

In the following, the invention is described in greater detail using exemplary embodiments and the corresponding figures.

DETAILED DESCRIPTION

Figure 1:
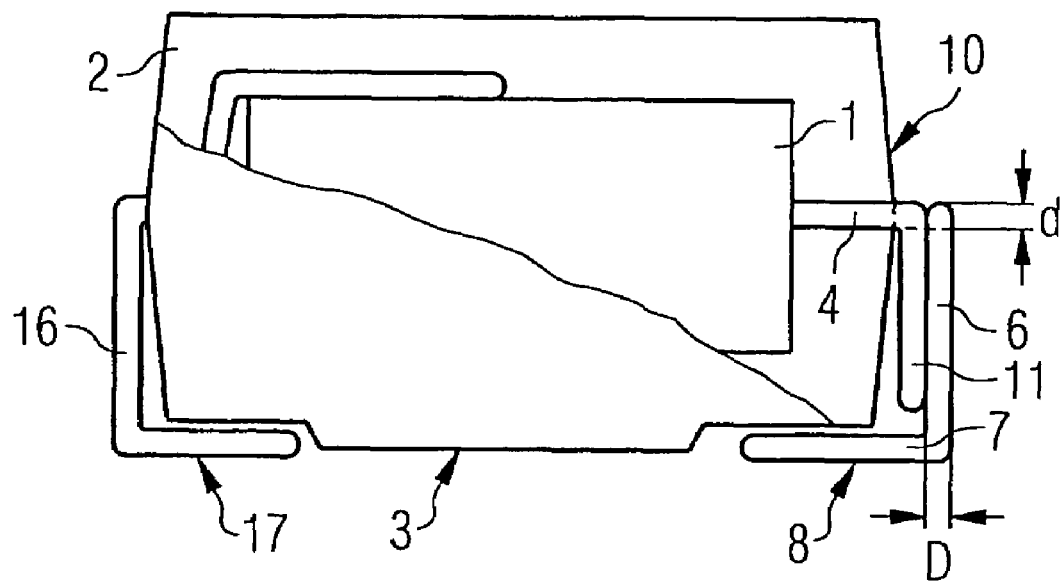
FIG. 1 depicts, in an exemplary manner, a capacitor according to the invention in a schematic cross section.

FIG. 1 depicts a capacitor with an anode body 1, which is surrounded by a housing 2. The anode body 1 can, for example, be a porous sintered body of tantalum or niobium powder. The housing 2 can, for example, be made of an injection moldable plastic. An anode contact 4 extends outward from the anode body 1, exiting it at a face side 10 of the housing 2. At the point of exit of the anode contact 4 from the housing 2, the anode contact is bent in the direction of the base surface 3 of the housing 2. An anode connector 6 is welded onto a segment 11 of the anode contact 4, whereas the anode contact 4 preferably consists of a metal corresponding to the anode body 1, such as tantalum or niobium, a material that can be joined by means of soft soldering is selected for the anode connector 6.

In addition to the materials copper, nickel, iron, precious metals, cobalt or steel, materials that can be used for this purpose include a nickel/iron alloy, especially a 42NiFe alloy with a partial coating of nickel, copper, tin and silver. Such materials are normally used for system carriers. Accordingly, the capacitor according to the invention can be economically produced in large quantities by using system carriers for the anode contact 6 as well as for the cathode contact 16.

An advantage of using soft-solderable material for the anode connector 6 is that a soldering surface 8 can be formed by bending over the anode connector 6, thus forming a segment 7 of the anode connector 6 on the base surface 3 of the housing 12. Cathode contact 16, which is bent around the housing 2 in a manner corresponding to the anode contact 6, is applied to the cathode mounted on the anode body 1, thereby creating another soldering surface 17 on the base surface 3 of the housing 2 that can be used to solder the cathode of the capacitor to a printed circuit board.

As a result of a soldering surface 8 and/or a second soldering surface 17 being provided on the base surface 3 of the housing 2, a capacitor is created in chip construction, which, in particular, is advantageously suited for use in surface mounting technology.

In the example shown in FIG. 1, the thickness d of the anode contact 4 is approximately 0.75 mm. The thickness D of the anode contact 6 is 0.9±0.1 mm. The capacitor shown in FIG. 1 has an advantage over the example from FIG. 2, in that the weld joint between the anode contact 4 and the anode connector 6 only requires a capacitor width equal to the sum of d and D, so that, in a lateral direction, maximum utilization of the housing 2 and therefore higher capacities can be achieved without altering the size of the housing.

Figure 2:
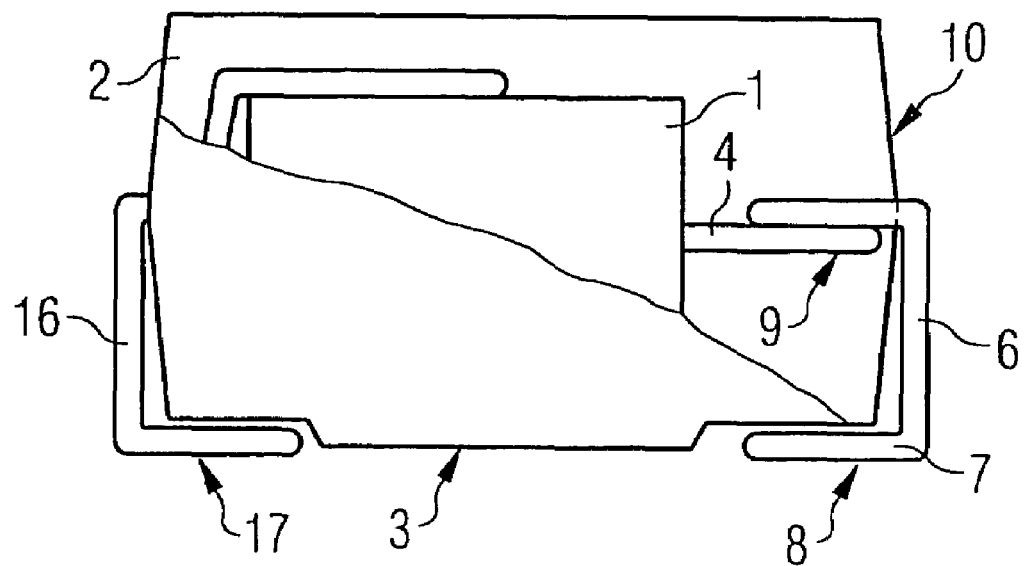
FIG. 2 depicts, in an exemplary manner, another capacitor according to the invention in a schematic cross section.

FIG. 2 depicts another embodiment of the invention, in which a terminal segment 9 of the anode contact 4 provided within the housing 2 is welded two-dimensionally to the anode connector 6. Within the scope of the invention, welding can be achieved by means of laser welding.

The anode connector 6 exits the housing 2 on a face 10 thereof, where it is bent in the direction of the base surface 3 of the housing 2. At the edge between the face 10 and the base surface 3 of the housing, the anode connector 3 is bent inward a second time, so that a terminal segment of the anode connector 6 forms a soldering surface 8 at the base surface 3 of the housing 2.

Although the embodiment of the invention shown in FIG. 2 does not utilize the housing as effectively as the embodiment in FIG. 1, it has the advantage that the anode contact 4 can be designed to be shorter, resulting in savings in the relatively expensive tantalum or niobium material normally used for the anode contact 4.

Figure 3:
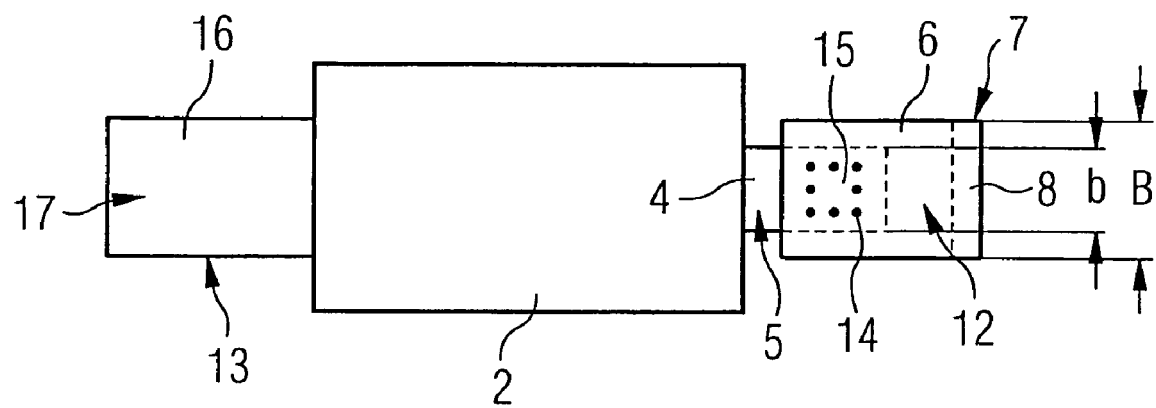
FIG. 3 depicts, in an exemplary manner, a capacitor according to the invention during production, in an aerial view.

FIG. 3 shows a capacitor of the invention in accordance with the embodiment shown in FIG. 1, during production. The housing 2 has already been sprayed onto the anode body 1. On the two faces of the housing 2, the cathode contact 16 and the anode contact 4 emerge from the housing on the left side. The anode contact 4 and the anode connector 6 are in the shape of a strip 13 running in a longitudinal direction. As a result, the anode contact 4 features a flat side 5. The anode contact 4 and the anode connector 6 are in the shape of a strip running in a longitudinal direction overlap in the area identified by the dashed line. The weld joint between the anode contact 4 and the anode connector 6 is produced by means of weld points 14, which delimit a surface 15. As a result, a stable connection can be achieved between the anode contact 4 and the anode connector 6. The width b of the anode contact 4 can be adjusted to a width B of a soldering surface that is larger for reasons of standardization by appropriate selection of the width B of the anode connector 6. The anode connector 6 also has a flat side 12. The two flat sides 12, 14 of the anode contact 4 and the anode connector 6 overlap one another.

At the end of the anode connector 6, there is a segment 7 that, once the anode connector 6 has been bent around the housing 2, comes to rest on the underside of the housing 2, where it forms a soldering surface 8. In the same fashion, the cathode contact 16 is bent around the housing 2, forming another soldering surface 17 on the underside of the housing 2.

The invention can be realized with any material that forms a suitable, porous sintered body, and is not limited to tantalum or niobium.

The production of the capacitor can, for example, proceed as follows:

The anode body 1 with an anode contact 4 emerging from it 4 is provided. The anode contact 4 is welded to an anode connector 6. In addition, the anode body 1 is connected to a cathode contact 16 in an electrically conductive manner. For a large number of capacitors, the cathode contact 16 and the anode connector 6 are provided as parts of a system carrier. The system carrier already provides a cathode contact 16 and anode connector 6 with the appropriate dimensions, so that the anode body 1 and the anode contact 4 must only be placed into the system carrier. After the anode contact 4 and the anode connector 6 have been welded together, a plastic housing is sprayed onto the anode body 1. Then the cathode contact 16 and the anode connector 6 are bent around the housing and onto the base surface 3 of the housing 2. There they form a first and a second soldering surface 8, 17.

It is also possible to place multiple anode bodies 1 into the system carrier, spray on the housing 2, and then separate them. The bending of the anode contact 6 and/or cathode contact 16 takes place after separation.

The invention claimed is:

1. A capacitor comprising:
   an anode body;
   a housing having a base surface and enclosing at least said anode body;
   an anode contact extending outward from the interior of said anode body, said anode contact having at least one flat surface;
   an anode connector having flat opposing surfaces formed;
   a) from a metal; b) welded to said anode contact; c) soft-solderable to another surfaces; and d) formed both to contact said anode contact and to be parallel to said base surface.

2. A capacitor according to claim 1 wherein said anode contact contains a refractory metal.

3. A capacitor according to claim 2 wherein said refractory metal is selected from the group consisting of titanium, zirconium, hafnium, tantalum, niobium, vanadium, tungsten and molybdenum.

4. A capacitor according to claim 1 wherein said anode contact contains a non-solderable metal.

5. A capacitor according to claim 4 wherein said non-solderable metal is selected from the group consisting of zirconium, tantalum, niobium, molybdenum and tungsten.

6. A capacitor according to claim 1 wherein said anode connector is formed from a soft-solderable metal selected from the group consisting of nickel, copper, cobalt, tin, precious metals and steel and their alloys.

7. A capacitor according to claim 1 wherein said anode contact and said anode connector are the same width.

8. A capacitor according to claim 1 wherein said anode contact and said anode connector have different widths.

9. A capacitor according to claim 8 wherein said anode connector is wider than said anode contact.

10. A capacitor according to claim 8 wherein said anode connector has a soft-solderable surface in the plane of said housing base surface which conforms to a standard case size for a surface mount capacitor.

11. A capacitor according to claim 1 wherein said anode contact is welded to said anode connector within said housing.

12. A capacitor according to claim 11 wherein said anode contact projects from the plane of said anode body and is welded to said anode connector in that plane.

13. A capacitor according to claim 1 wherein said anode contact is welded to said anode connector outside of said housing.

14. A capacitor according to claim 13 wherein said anode contact is bent in the direction of toward said housing base surface and welded to said anode connector along that direction.

* * * * *